US012680002B2

(12) United States Patent
Choi et al.

(10) Patent No.: US 12,680,002 B2
(45) Date of Patent: Jul. 14, 2026

(54) UNDERFILL FILM FOR SEMICONDUCTOR PACKAGE AND METHOD FOR MANUFACTURING SEMICONDUCTOR PACKAGE USING SAME

(71) Applicant: DOOSAN CORPORATION, Seoul (KR)

(72) Inventors: Taejin Choi, Yongin-si (KR); Sooin Park, Yongin-si (KR)

(73) Assignee: DOOSAN CORPORATION, Seoul (KR)

( * ) Notice: Subject to any disclaimer, the term of this patent is extended or adjusted under 35 U.S.C. 154(b) by 883 days.

(21) Appl. No.: 17/782,452

(22) PCT Filed: Dec. 4, 2020

(86) PCT No.: PCT/KR2020/017668
§ 371 (c)(1),
(2) Date: Jun. 3, 2022

(87) PCT Pub. No.: WO2021/112627
PCT Pub. Date: Jun. 10, 2021

(65) Prior Publication Data

US 2023/0027838 A1 Jan. 26, 2023

(30) Foreign Application Priority Data

Dec. 5, 2019 (KR) ........................ 10-2019-0160625

(51) Int. Cl.
*C09J 7/35* (2018.01)
*C09J 5/06* (2006.01)
(Continued)

(52) U.S. Cl.
CPC . *C09J 7/35* (2018.01); *C09J 5/06* (2013.01); *C09J 2203/326* (2013.01);
(Continued)

(58) Field of Classification Search
CPC . C09J 7/35; C09J 5/06; C09J 2301/304; C09J 2203/326; C09J 2463/00;
(Continued)

(56) References Cited

U.S. PATENT DOCUMENTS

2013/0289225 A1* 10/2013 Kondo .................... H01L 24/29 525/476
2016/0312070 A1 10/2016 Huang
2018/0226313 A1* 8/2018 Bai ...................... C09D 163/00

FOREIGN PATENT DOCUMENTS

JP 2013-219286 A 10/2013
JP 2013-227429 A 11/2013
(Continued)

OTHER PUBLICATIONS

JPO Machine Translation of JP2014-198762 (Year: 2014).*
(Continued)

*Primary Examiner* — John M Cooney
*Assistant Examiner* — Adam J Berro
(74) *Attorney, Agent, or Firm* — Sughrue Mion, PLLC

(57) ABSTRACT

An underfill film for a semiconductor package and a method for manufacturing a semiconductor package using the underfill film are disclosed. The underfill film is suitable for a semiconductor package, which, by including an adhesive layer having low lowest melt viscosity, can improve the connection reliability of a package by minimizing the formation of voids during semiconductor packaging.

13 Claims, 2 Drawing Sheets

(51) Int. Cl.

| | |
|---|---|
| ***H10W 74/15*** | (2026.01) |
| *H10W 72/00* | (2026.01) |
| *H10W 72/30* | (2026.01) |
| *H10W 99/00* | (2026.01) |

(52) U.S. Cl.
CPC ...... *C09J 2301/304* (2020.08); *C09J 2463/00* (2013.01); *H10W 72/07232* (2026.01); *H10W 72/07338* (2026.01); *H10W 72/354* (2026.01); *H10W 74/15* (2026.01); *H10W 99/00* (2026.01)

(58) Field of Classification Search
CPC ......... H01L 24/81; H01L 24/83; H01L 24/92; H01L 24/29; H01L 24/73; H01L 2224/2919; H01L 2224/73104; H01L 2224/73204; H01L 2224/81201; H01L 2224/83855; H01L 2224/9211

See application file for complete search history.

(56) References Cited

FOREIGN PATENT DOCUMENTS

| | | | |
|---|---|---|---|
| JP | 2015-56500 | A | 3/2015 |
| JP | 2015-216317 | A | 12/2015 |
| JP | 2019-509620 | A | 4/2019 |
| KR | 10-2008-0113670 | A | 12/2008 |
| KR | 10-2013-0087407 | A | 8/2013 |
| KR | 10-2017-0113430 | A | 10/2017 |
| WO | 2008/129590 | A1 | 10/2008 |
| WO | 2015/037584 | A1 | 3/2015 |
| WO | 2017/062586 | A1 | 4/2017 |

OTHER PUBLICATIONS

Japanese Office Action issued Jun. 20, 2023 in JP Application No. 2022-533658.

Extended European Search Report dated Apr. 15, 2024, issued in European Application No. 20896504.6.

International Search Report for PCT/2020/017668 dated, Apr. 5, 2021 (PCT/ISA/210).

* cited by examiner

UNDERFILL FILM FOR SEMICONDUCTOR PACKAGE AND METHOD FOR MANUFACTURING SEMICONDUCTOR PACKAGE USING SAME

CROSS REFERENCE TO RELATED APPLICATIONS

This application is a National Stage of International Application No. PCT/KR2020/017668 filed Dec. 4, 2020, claiming priority based on Korean Patent Application No. 10-2019-0160625 filed Dec. 5, 2019.

TECHNICAL FIELD

The present disclosure relates to an underfill film for a semiconductor package and a method for manufacturing a semiconductor package using the same and, specifically, to an underfill film for a semiconductor package, capable of improving the reliability of the package through the minimization of void formation in the manufacturing of the semiconductor package, and to a method for manufacturing a semiconductor package using the same.

BACKGROUND ART

The recent trends toward smaller and higher-density electronic devices have been focusing on the manufacture of flip-chip packages in which a semiconductor device can be mounted with a minimum area.

In the manufacture of flip chip packages, an underfill is disposed in a space between a semiconductor chip and a package substrate. The underfill protects the package structure from external influences, such as mechanical shock and bonding portion corrosion, as well as minimizes the stress resulting from a difference in the coefficient of thermal expansion between the chip and the substrate, thereby improving the reliability of packaged products.

Such an underfill is formed by, after a solder reflow process, filling a liquid underfill resin in the space between the semiconductor chip and the package substrate by means of a device such as a needle, following curing.

In the filling process of the liquid underfill resin, the underfill resin needs to be uniformly provided in the entire region of the empty space between the semiconductor chip and the package substrate. Therefore, a needle movement space for moving the needle along the side surface of the semiconductor chip in a constant trajectory as well as an extra space for disposing the needle needs to be ensured. This causes space consumption, which becomes an obstacle to the minimization of products using flip chips.

In the filling process of the liquid underfill resin, air gaps or voids are formed in the underfill since there is a difference in diffusion rate of the liquid underfill resin due to circuit patterns and bonding pads of a printed circuit board and a solder of a semiconductor chip. These air gaps or voids degrade the functions of the underfill and, in the long term, cause the penetration of moisture to result in deterioration in the reliability of a package.

DISCLOSURE OF INVENTION

Technical Problem

An aspect of the present disclosure is to provide an underfill film for a semiconductor package, capable of improving connection reliability through the minimization of void formation while simplifying a bonding process during semiconductor packaging.

Another aspect of the present disclosure is to provide a method for manufacturing a semiconductor package, capable of achieving the simplification of a bonding process and an improvement in production efficiency and producing a semiconductor package with excellent connection reliability by using the above-described underfill film.

Solution to Problem

In accordance with an aspect of the present disclosure, there is provided an underfill film for a semiconductor package, including: a base; and an adhesive layer disposed on one surface of the base and having a lowest melt viscosity of 3000 Pa·s or less at 160 to 170° C.

In accordance with another aspect of the present disclosure, there is provided a method for manufacturing a semiconductor package, the method including: compressing the adhesive layer of the above-described underfill film on bumps of a semiconductor chip with the bumps; aligning the bumps of the semiconductor chip, on which the adhesive layer has been compressed, with bonding pads of a package substrate, the bonding pads being included in regions corresponding to positions of the bumps; melting the bumps of the semiconductor chip to connect the semiconductor chip to the package substrate; and curing the adhesive layer disposed between the connected semiconductor chip and package substrate.

Advantageous Effects of Invention

According to the present disclosure, by including an adhesive layer with a low lowest melt viscosity, a bonding process is simplified during semiconductor packaging, and the connection reliability of a semiconductor package can be improved through the minimization of void formation.

EXPLANATION OF REFERENCE NUMERALS

| | |
|---|---|
| 10A, 10B: underfill film, | 11: base |
| 12: adhesive layer | 12': cured adhesive layer |
| 13: second base | 20: semiconductor chip |
| 21: bump | 30: package substrate |
| 31: bonding pad | |

BEST MODE FOR CARRYING OUT THE INVENTION

Hereinafter, the present disclosure will be described in detail.

<Underfill Film for Semiconductor Package>

Figure 1:
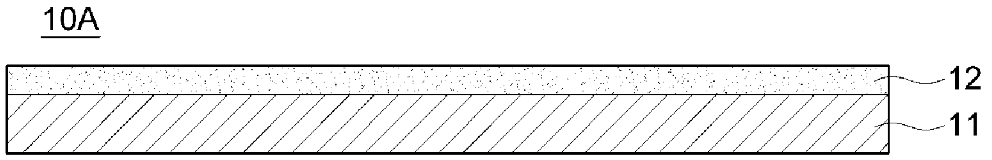
FIG. 1 is a cross-sectional view schematically showing an underfill film for a semiconductor package according to a first embodiment of the present disclosure.
Figure 2:
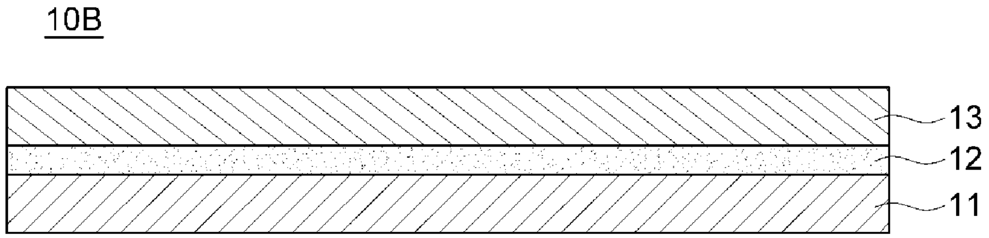
FIG. 2 is a cross-sectional view schematically showing an underfill film for a semiconductor package according to a second embodiment of the present disclosure.

FIG. 1 is a cross-sectional view schematically showing an underfill film for a semiconductor package according to a first embodiment of the present disclosure. FIG. 2 is a cross-sectional view schematically showing an underfill film for a semiconductor package according to a second embodiment of the present disclosure.

Each of underfill films 10A and 10B according to the present disclosure is a non-conductive film used to mitigate the stress applied to connection portions between bumps of a semiconductor chip and bonding pads of a package substrate during semiconductor packaging, and includes a base 11 and an adhesive layer 12 disposed on one surface of the base as shown in FIGS. 1 and 2. Optionally, the underfill film may further include another base (hereinafter, "second base") 13 disposed on the other surface of the adhesive layer (see FIG. 2).

Hereinafter, the underfill film 10A for a semiconductor package according to the first embodiment of the present disclosure will be described with reference to FIG. 1.

1) Base

In the underfill film according to the present disclosure, the base 11 protects the surface of the adhesive layer while supporting the adhesive layer, and is peeled off and removed when the underfill film is used.

Any plastic film may be used as the base 11 without limitation as long as the plastic film is commonly known in the art and can be peeled off. A release paper may also be used.

Non-limiting examples of the plastic film that can be used include polyester films, such as polyethylene terephthalate (PET), polybutylene terephthalate, and polyethylene naphthalate, polyethylene films, polypropylene films, cellophanes, diacetyl cellulose films, triacetyl cellulose films, acetyl cellulose butyrate films, polyvinyl chloride films, polyvinylidene chloride films, polyvinyl alcohol films, ethylene-vinyl acetate copolymer films, polystyrene films, polycarbonate films, polymethylpentene films, polysulfone films, polyetheretherketone films, polyethersulfone films, polyetherimide films, polyimide films, fluororesin films, polyamide films, acrylic resin films, norbornene-based resin films, cycloolefin resin films, and the like. Such a plastic film may be transparent or semi-transparent, or may or may not be colored. According to an embodiment, the base 11 may be polyethylene terephthalate (PET). According to another embodiment, the base 11 may be a polyimide (PI).

A release layer may be disposed on such a plastic film. When the base 11 is separated from the adhesive layer 12, the release layer can easily separate the base from the adhesive layer while the adhesive layer maintains its shape without being damaged. The release layer may be a film-type release material that is usually used.

A release agent component used in the release layer is not particularly limited, and any conventional release agent component known in the art may be used. Non-limiting examples thereof may include an epoxy-based release agent, a release agent formed of a fluororesin, a silicone-based release agent, an alkyd resin-based release agent, a water-soluble polymer, and the like. As needed, a powder form of filler, such as silicone or silica, may be contained as a component of a release layer. In such a case, two types of powder fillers may be used in mixture as a fine particle form of powder filler, and the average particle size thereof may be appropriately selected considering the surface roughness to be formed.

The thickness of the release layer may be appropriately adjusted within a conventional range known in the art.

In the present disclosure, the thickness of the base 11 is not particularly limited and may be adjusted within a conventional range known in the art, for example, about 25 to 150 μm, specifically about 30 to 100 μm, and more specifically about 30 to 50 μm.

The release force of the base 11 is not particularly limited, and may be in the range of, for example, about 1 to 500 gf/inch, and specifically about 10 to 100 gf/inch.

A method of forming the release layer is not specifically limited, and any well-known method, such as heat press, heated roll lamination, extrusion lamination, application of a coating liquid, and drying, may be adopted.

(2) Adhesive Layer

In the underfill film according to the present disclosure, the adhesive layer 12 is disposed on one surface of the base 11. And thus, the adhesive layer of the underfill film can attach a semiconductor chip to a package substrate when a semiconductor chip is aligned with the package substrate in semiconductor packaging. And, the adhesive layer of the underfill film can be used as an underfill to re-distribute stress and strain caused by a difference in coefficient of thermal expansion between the semiconductor chip and the package substrate.

The adhesive layer 12 of the present disclosure is in a semi-cured state and has a lowest melt viscosity of about 3000 Pa·s or less at 160 to 170° C. When the adhesive layer 12 is disposed between a semiconductor chip with bumps and a package substrate with bonding pads, followed by compression under the conditions of 200° C., 30-100 N, and 1-3 seconds, the void area percentage of the adhesive layer is 1% or less.

Specifically, the adhesive layer 12 of the present disclosure is easily melted to have fluidity even under the conditions of about 200° C., 50 N, and about 1 to 3 seconds since the lowest melt viscosity of the adhesive layer is as low as about 3000 Pa·s or less, preferably about 100 to 1000 Pa·s, at about 160 to 170° C. Therefore, the adhesive layer 12 is disposed between the bumps of the semiconductor chip and the bonding pads of the package substrate when the bumps of the semiconductor chip is pre-bonded to the bonding pads of the package substrate. This adhesive layer 12 may be melted to fill an empty space between the bumps and the bonding pads during pre-bonding. In particular, the adhesive layer can fill even a fine empty space of a fine pitch due to high fluidity thereof. In addition, the adhesive layer of the present disclosure can serve not only as an underfill but also as a flux, thereby eliminating the need of flux application on the bonding pads and the need of flux washing. Therefore, voids are not formed due to flux residues or flux washing solvent residues. As such, the adhesive layer of the present disclosure has an excellent gap-filling effect and can minimize void formation. According to an embodiment, the void area percentage in the adhesive layer is 1% or less per $m^2$ after compression under the conditions of about 200° C., about 30-100 N, and about 1-3 seconds, and this void area percentage in the adhesive layer may be lowered to 0.5% or less when the bumps are melted in a subsequent reflow process.

In the adhesive layer 12, the onset temperature on a differential scanning calorimeter (DSC) is as high as about 160 to 220° C. Therefore, the adhesive layer has stable curing properties at high temperatures. The onset temperature refers to a temperature at a time point at which the slope on the DSC graph increases for the first time by heat generation, as measured by DSC.

The thickness of the adhesive layer is adjusted considering the lowest melt viscosity of the adhesive layer or the like.

According to an embodiment, the thickness of the adhesive layer may be in the range of 80 to 120% of the interval between the semiconductor chip and the package substrate.

The adhesive layer 12 is a semi-cured product of an adhesive resin composition, wherein the adhesive resin composition contains: (a) an epoxy resin containing a liquid epoxy resin, a phenoxy resin, and a multifunctional epoxy resin; (b) an acid anhydride curing agent; (c) a nitrogen (N)-containing heterocyclic compound; and (d) a filler.

In the adhesive resin composition, the epoxy resin contains a liquid epoxy resin, a phenoxy resin, and a multifunctional epoxy resin. The ratio of use (mixing) of the liquid epoxy resin, the phenoxy resin, and the multifunctional epoxy resin may be a weight ratio of 1:1-3:1-3. In such a case, the adhesive layer of the present disclosure has excellent adhesiveness and filling effects since the lowest melt viscosity of the adhesive layer is as low as about 3000 Pa·s or less, and thus can ensure connection reliability of the package.

In the adhesive resin composition, the liquid epoxy resin is in a liquid state at 25±5° C. and is a thermosetting resin. Such a liquid epoxy resin can give adhesiveness and curability to the adhesive resin composition and can give curing uniformity to the adhesive layer after curing.

Non-limiting examples of a liquid epoxy resin usable in the present disclosure include liquid bisphenol A-type epoxy resins, liquid bisphenol F-type epoxy resins, liquid naphthalene-type epoxy resins, liquid aminophenol-based epoxy resins, liquid hydrogenated bisphenol-type epoxy resins, liquid alicyclic epoxy resins, liquid alcohol ether-type epoxy resins, liquid cycloaliphatic-type epoxy resins, liquid fluorene-type epoxy resins, liquid siloxane-based epoxy resins, and the like, among which liquid bisphenol A-type epoxy resins, liquid bisphenol F-type epoxy resins, and liquid naphthalene-type epoxy resins are appropriate in view of adhesiveness, curability, durability, and heat resistance. These may be used alone or in combination of two or more thereof.

Specifically, examples of liquid epoxy resin products include a bisphenol F-type epoxy resin (product name: YDF8170) manufactured by Nippon Steel & Sumikin Chemical, a bisphenol A-type epoxy resin (product name: EXA-850CRP) manufactured by DIC, a bisphenol F-type epoxy resin (product name YDF870GS) manufactured by Nippon Steel & Sumikin Chemical, a naphthalene-based epoxy resin (product name HP4032D) manufactured by DIC, an aminophenol-based epoxy resin (grade JER630, JER630LSD) manufactured by Mitsubishi Chemical, a siloxane-based epoxy resin (product name TSL9906) manufactured by Momentive Performance Materials, and 1,4-cyclohexanedimethanol diglycidyl ether (product name ZX1658GS) manufactured by Nippon Steel & Sumikin Chemical, but embodiments are not limited thereto.

In the adhesive resin composition, the phenoxy resin is a thermoplastic polymer containing an epoxy group in at least one end, and the equivalent of the epoxy group in a molecule is very small compared with a molecular weight thereof, and thus the resin is involved in curing but can give fluidity at high temperatures. Due to such a phenoxy resin, the adhesive layer of the present disclosure can be molded into a film shape in a semi-cured (B-stage state) at room temperature (about 25±5° C.)

Any polymer that contains a phenoxy group in a polymer chain and contains an epoxy group in at least one end thereof may be used without particular limitation as a phenoxy rein usable in the present disclosure.

For example, the phenoxy resin may be a compound represented by Chemical Formula 1 below, but is not limited thereto:

[Chemical Formula 1]

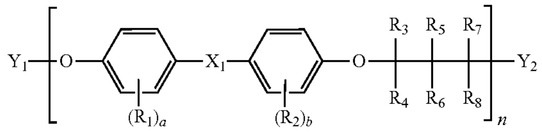

(wherein, in chemical formula 1, a and b are each an integer of 1 to 4;

a plurality of $R_1$ and a plurality of $R_2$ are the same as or different from each other and are each independently selected from the group consisting of hydrogen, halogen, a $C_1$-$C_{10}$ alkyl group, a $C_3$-$C_{20}$ cycloalkyl group, a $C_5$-$C_{20}$ aryl group and a nitro group, and specifically, each differently selected from the group consisting of hydrogen, halogen, a $C_1$-$C_5$ alkyl group, a $C_3$-$C_{10}$ cycloalkyl group, a $C_5$-$C_{10}$ aryl group, and a nitro group;

$R_3$ to $R_8$ are the same as or different from each other and are each independently hydrogen or a hydroxy group, provided that at least one of $R_3$ to $R_8$ is a hydroxy group;

$X_1$ is a single bond or a $C_1$-$C_{10}$ alkylene group, and specifically, a single bond or a $C_1$-$C_5$ alkylene group;

$Y_1$ and $Y_2$ are the same as or different from each other and are each independently hydrogen, a hydroxy group, or an epoxy group, provided that at least one of $Y_1$ and $Y_2$ is an epoxy group; and n is an integer of 30 to 400).

The multifunctional epoxy resin usable in the present disclosure is an epoxy resin containing at least two epoxy groups. Such a multifunctional epoxy resin gives electrical insulation, heat resistance, chemical stability, toughness, and moldability to the adhesive layer.

Any epoxy resin that contains at least two epoxy groups, specifically, two to five epoxy groups, per molecule (monomer) may be used without particular limitation as a multifunctional epoxy resin usable in the present disclosure.

Non-limiting examples of the multifunctional epoxy resin include epoxy resins obtained by epoxidizing condensates of phenol or alkyl phenols with hydroxybenzaldehyde, phenol novolac-type epoxy resins, cresol novolac-type epoxy resins, phenol aralkyl-type epoxy resins, biphenyl-type epoxy resins, bisphenol A-type epoxy resins, bisphenol F-type epoxy resins, linear aliphatic epoxy resins, alicyclic epoxy resins, heterocyclic epoxy resins, epoxy resins containing spiro-ring, xylok-type epoxy resins, multifunctional epoxy resins, naphthol novolac-type epoxy resins, bisphenol A/bisphenol F/bisphenol AD novolac-type epoxy resins, bisphenol A/bisphenol F/bisphenol AD glycidyl ether epoxy resins, bishydroxybiphenyl-based epoxy resins, dicyclopentadiene-based epoxy resins, naphthalene-based epoxy resins, and the like. Out of these, a multifunctional epoxy resin in a non-liquid phase at 25±5° C. is preferable. The non-liquid phase at 25±5° C. indicates an epoxy resin in a semi-solid phase or a solid phase at 25±5° C., and also includes an epoxy resin close to a solid phase.

The adhesive resin composition contains an acid anhydride curing agent. The acid anhydride curing agent can exhibit flux properties while curing at least one of a liquid epoxy resin, a phenoxy resin, and a multifunctional epoxy resin.

Non-limiting examples of the acid anhydride-based curing agent include tetrahydrophthalic anhydride, methyl tetrahydrophthalic anhydride, methyl hexahydrophthalic anhydride, hexahydrophthalic anhydride, trialkyl tetrahydrophthalic anhydride, methyl cyclohexene dicarboxylic anhydride, phthalic anhydride, maleic anhydride, pyromellitic anhydride, and the like, which may be used alone or in combination of two or more thereof.

The adhesive resin composition may further contain at least one curing agent known as a component for curing an epoxy resin in the art, in addition to the above-described acid anhydride-based curing agents. Examples thereof include: aromatic amine-based curing agents, such as metaphenylene diamine, diaminodiphenyl methane, and diaminodiphenyl sulfone; aliphatic amine-based curing agents, such as diethylene triamine and triethylene tetraamine; phenol-based curing agents, such as phenol aralkyl-type phenol resins, phenol novolac-type phenol resins, xylok-type phenol resins, cresol novolac-type phenol resins, naphthol-type phenol resins, terpene-type phenol resins, multifunctional phenol resins, dicyclopentadiene-based phenol resins, naphthalene-type phenol resins, novolac-type phenol resin synthesized from bisphenol A and resole; and potential curing agents such as dicyandiamide. These curing agents may be used alone or in combination of two or more thereof.

The adhesive resin composition contains a nitrogen (N)-containing heterocyclic compound. The N-containing heterocyclic compound is a kind of curing catalyst capable of accelerating curing, and can not only control the curing rate but also ensure high-temperature stability of the adhesive layer.

This nitrogen (N)-containing heterocyclic compound is at least one selected from the group consisting of a compound represented by Chemical Formula 2 and a compound represented by Chemical Formula 3:

[Chemical Formula 2]

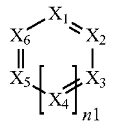

[Chemical Formula 3]

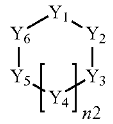

wherein, in Chemical Formulas 2 and 3, n1 is 1 or 2;

n2 is an integer of 0 to 2;

$X_1$ to $X_6$ are the same as or different from each other and are each independently N or $C(R_1)$, provided that at least one of $X_1$ to $X_6$ is N;

$Y_1$ to $Y_6$ are the same as or different from each other and are each independently $N(R_2)$ or $C(R_3)(R_4)$, provided that at least one of $Y_1$ to $Y_6$ is $N(R_2)$;

a plurality of $C(R_1)$ are the same as or different from each other, a plurality of $N(R_2)$ are the same as or different from each other, and a plurality of $C(R_3)(R_4)$ are the same as or different from each other; and $R_1$, $R_2$, $R_3$, and $R_4$ are each independently selected from the group consisting of hydrogen, deuterium (D), halogen, a cyano group, a nitro group, a $C_1$-$C_{20}$ alkyl group, a $C_2$-$C_{20}$ alkenyl group, and a $C_2$-$C_{20}$ alkynyl group).

Specifically, in Chemical Formula 2, one or two of $X_1$ to $X_6$ may be N and the others may be $C(R_1)$.

In Chemical Formula 3, one or two of $Y_1$ to $Y_6$ may be $N(R_2)$ and the others may be $C(R_3)(R_4)$.

In Chemical Formulas 2 and 3, $R_1$, $R_2$, $R_3$, and $R_4$ are each independently selected from the group consisting of hydrogen, deuterium (D), halogen, a cyano group, a nitro group, a $C_1$-$C_{12}$ alkyl group, a $C_2$-$C_{12}$ alkenyl group, and a $C_2$-$C_{12}$ alkynyl group.

Examples of the compound represented by Chemical Formula 2 may include pyrazine-based compounds, pyridine-based compounds, and the like, but are not limited thereto. Specifically, non-limiting examples of the compound represented by Formula 2 may be a compound represented by Chemical Formula 2a below or the like.

[Chemical Formula 2a]

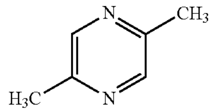

Examples of the compound represented by Chemical Formula 3 may include piperazine-based compounds and the like, but are not limited thereto. Specifically, non-limiting examples of the compound represented by Chemical Formula 3 may be a compound represented by Chemical Formula 3a below, a compound represented by Chemical Formula 3b below, or the like.

[Chemical Formula 3a]

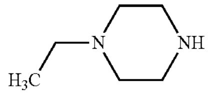

[Chemical Formula 3b]

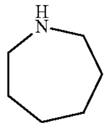

According to an embodiment, the N-containing heterocyclic compound may include at least one selected from the group consisting of a pyrazine-based compound, a pyridine-based compound, and a piperazine-based compound.

In the adhesive resin composition of the present disclosure, the content of the N-containing heterocyclic compound is preferably adjusted considering the total content of the liquid epoxy resin, the phenoxy resin, and the multifunctional epoxy resin or the ratio of use thereof, and the type and content of the acid anhydride-based curing agent. According to an embodiment, in the adhesive resin composition of the present disclosure, the content of the epoxy resin (that is, the total content of the liquid epoxy resin, the phenoxy resin, and the multifunctional epoxy resin) may be in the range of about 40 to 80 wt % relative to the total amount of the resin composition, the content of the acid anhydride-based curing agent may be in the range of about 5 to 20% by weight relative to the total amount of the resin composition, and the content of the N-containing heterocyclic compound may be in the range of about 0.01 to 5 wt % relative to the total amount of the resin composition. The ratio of use (mixing) of the liquid epoxy resin, the phenoxy resin, and the multifunctional epoxy resin may be a weight ratio of 1:1-3:1-3.

In such a case, the adhesive layer of the present disclosure is easy to handle, has excellent adhesive strength, and has the minimized void formation due to a lowest melt viscosity of about 3000 Pa·s or less at about 160 to 170° C., and thus exhibits excellent filling properties, leading to an improvement in connection reliability.

The adhesive resin composition contains a filler. The filler expresses thixotropic property and thus can adjust the melt viscosity, enhance adhesiveness, and lower the coefficient of thermal expansion.

This filler may be an organic filler or an inorganic filler. Specifically, examples of the inorganic filler include: metal components, such as a gold powder, a silver powder, a copper powder, and a nickel powder; and non-metal components, such as alumina, aluminum hydroxide, magnesium hydroxide, calcium carbonate, magnesium carbonate, calcium silicate, magnesium silicate, calcium oxide, magnesium oxide, aluminum oxide, aluminum nitride, silica, boron nitride, titanium dioxide, glass, iron oxide, and ceramic, and examples of the organic filler include carbon, a rubber-based filler, a polymer-based filler, and the like, but are not limited thereto. These may be used alone or in combination of two or more thereof.

The shape and size of the filler are not particularly limited and, for example, the shape of the filler may be angular, spherical, or the like, and the average particle diameter thereof may be in the range of about 10 to 100 nm. If the average particle diameter of the filler is within the above-described range, the mechanical properties of the cured product may be further improved. According to an embodiment, the filler may be silica having an average particle diameter of about 10 to 100 nm.

The content of such a filler is not particularly limited and, for example, the content thereof may correspond to a remainder that adjusts the total amount of the adhesive resin composition to be 100 wt % and, specifically, may be about 10 to 50 wt % relative to the total amount of the adhesive resin composition. When a content of the filler is within the above range, an adhesive layer having a low coefficient of thermal expansion (CTE) may be formed, and accordingly, a difference in coefficient of thermal expansion between the substrate and the semiconductor element may be small, such that the occurrence of warpage or cracks may be substantially minimized.

The adhesive resin composition of the present disclosure may further optionally contain, in addition to the above-described ingredients, an additive that is commonly known in the art, as needed, according to the purpose and environment of use of the composition. Examples of the additive may be a solvent, such as acetone, methyl ethyl ketone, toluene, and ethyl acetate, an adhesion accelerator, a coupling agent, an antistatic agent, a contact property enhancer, a wettability improver, a leveling enhancer, and the like, but are not limited thereto.

The content of such an additive is not particularly limited, and the additive may be used in a common range known in the art. For example, the content of the additive may be about 0.01 to 10 wt % relative to the total weight of the resin composition.

The above-described adhesive resin composition may be prepared by a method that is commonly known in the art. For example, the adhesive resin composition may be prepared by mixing and stirring a liquid epoxy resin, a phenoxy resin, a multifunctional epoxy resin, an acid anhydride-based curing agent, an N-containing heterocyclic compound, a filler, and optionally an additive at room temperature or an appropriately elevated temperature through a mixing apparatus, such as a ball mill, a bead mill, a 3-roll mill, a basket mill, a dyno mill, or a planetary.

The underfill film according to the present disclosure may be manufactured by a method that is commonly known in the art. For example, the adhesive resin composition obtained through the above-described method can be mixed to an appropriate concentration to facilitate preparation of a coating film by diluting with a dilutable organic solvent, as needed. And then, the mixture is coated on a substrate, followed by drying, thereby manufacturing an underfill film.

The coating and drying method is not particularly limited as long as the method enables the formation of a coating film, such as bar coating, gravure coating, comma roll coating, roll reverse coating, roll knife coating, die coating, or lip coating.

Since the lowest melt viscosity of the above-described underfill film of the present disclosure is low, the underfill film can minimize void formation during pre-bonding between a semiconductor chip and a package substrate, improve the connection reliability of the package due to excellent filling properties, and can be applied to a fine pitch. Unlike the conventional art, a bonding process can be simplified and a mass reflow process can be performed.

Hereinafter, the underfill film 10B according to the second embodiment of the present disclosure will be described with reference to FIG. 2.

As shown in FIG. 2, the underfill film 10B of the present disclosure may include: a base (hereinafter, "first base") 11; an adhesive layer 12 disposed on one surface of the base; and another base (hereinafter, "second base") 13 disposed on the other surface of the adhesive layer 12.

Since the first base 11 and the adhesive layer 12 usable in the present disclosure are the same as those described in the base and the adhesive layer in the first embodiment, the description thereof is omitted.

In the present disclosure, the second base 13 is disposed on the other surface of the adhesive layer 12 to protect the surface of the adhesive layer while supporting the adhesive layer, and is peeled off and removed due to peelability thereof when the underfill film is used.

Such a second base 13 is the same as or different from the first base, and the description of examples of the second base overlaps that in the first embodiment and thus is omitted.

<Method for Manufacturing Semiconductor Package>

The present disclosure can provide methods for manufacturing various semiconductor packages by using the above-described underfill films 10A and 10B. Especially, the lowest melt viscosity of the underfill films 10A and 10B is as low as about 3000 Pa·s or less at about 160-170° C., so that when a semiconductor chip and a package substrate are aligned by compression at 200° C. for about 1-3 seconds, the underfill films easily have fluidity and thus can fill a gap between the semiconductor chip and the package substrate without void formation, thereby improving connection reliability of the semiconductor package. Therefore, the use of the above-described underfill film can simplify the manufacturing process of a semiconductor package, improve production efficiency, and produce a semiconductor package with excellent connection reliability.

For example, a method for manufacturing a semiconductor package includes: (a) disposing the adhesive layer for the above-described underfill film on bumps of a semiconductor chip with the bumps; (b) aligning the bumps of the semiconductor chip, on which the adhesive layer has been disposed, with bonding pads of a package substrate, the bonding pads being included in regions corresponding to positions of the bumps; (c) melting the bumps of the semiconductor chip to connect the semiconductor chip to the package substrate; and (d) curing the adhesive layer disposed between the connected semiconductor chip and package substrate. However, the above-described method of the present disclosure may be performed by modifying or selectively combining respective processes.

Hereinafter, a method for manufacturing a semiconductor packages according to the present disclosure will be described by steps with reference to FIGS. 3 to 6.

(a) Step of Disposing Adhesive Layer on Semiconductor Chip

Figure 3:
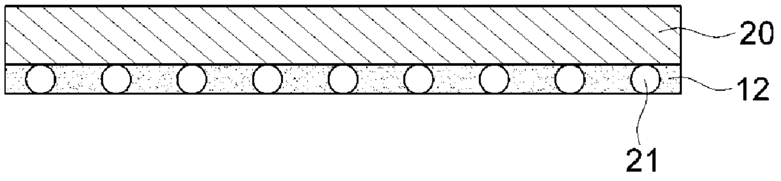
FIGS. 3 to 6 are cross-sectional views schematically showing a method for manufacturing a semiconductor package according to the present disclosure.

As shown in FIG. 3, the adhesive layer 12 of the above-described underfill films 10A and 10B is disposed on bumps 21 of a semiconductor chip 20 with the bumps 21 (hereinafter, "step S100").

In general, the semiconductor chip 20 has terminals (pads, not shown) for connecting an electronic circuit therein to the outside, wherein the pads are formed along the edge of the chip. Alternatively, the pads may be formed in one or two rows along the center of the chip, as needed.

The bumps 21 are formed on the pads of the semiconductor chip, respectively. The bumps are external terminals that electrically connect the substrate and the semiconductor chip during packaging, and may be solder bumps or Au bumps.

In the present disclosure, as shown in FIG. 3, the bases 11 and 13 are separated from the above-described underfill films 10A and 10B, and only the adhesive layer 12 is disposed on the bumps 21 of the semiconductor chip. The semiconductor chip 20 with the bumps 21 may be compressed and laminated on the adhesive layer 12 by a pressure of about 30-100 N. As needed, the semiconductor chip 20 may be compressed and laminated under a temperature lower than the onset temperature of the adhesive layer, for example, 50-150° C. Therefore, the adhesive layer is pressed in a B-stage state on the bumps of the semiconductor chip. Since the adhesive layer can serve as a flux as well as an underfill, the present disclosure requires no washing of the bumps with a flux, unlike the conventional art.

(b) Step of Aligning Semiconductor Chip and Substrate

The semiconductor chip 20, onto which the adhesive layer 12 is compressed in step S100, is aligned with a package substrate 30 (hereinafter, "step S200").

The package substrate 30 usable in the present disclosure is a substrate having a circuit pattern (not shown) formed on at least one surface thereof and may be, for example, a printed circuit board (PCB) or the like. The package substrate 30 has bonding pads formed at regions corresponding to the bumps 21 of the semiconductor chip 20.

Figure 4:
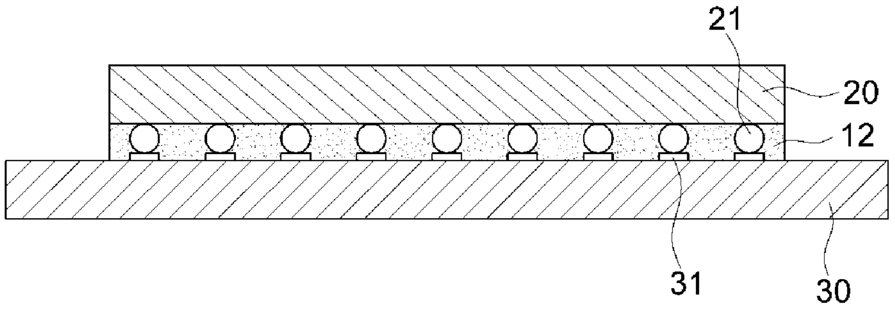

In the present disclosure, as shown in FIG. 4, the semiconductor chip 20 is mounted on the package substrate 30 such that the semiconductor chip 20 with the bumps 21 are arranged on the bonding pads 31. Specifically, the bump 21 of the semiconductor chip 20 are compressed onto the bonding pad 31 of the package substrate 30 under the conditions of about 200° C., about 30-100 N, and about 1-3 seconds, thereby pre-bonding the package substrate 30 and the semiconductor chip 20. The adhesive layer 12 disposed between the semiconductor chip 20 and the package substrate 30 flows since the lowest melt viscosity of the adhesive layer is low as described above. Therefore, the void area percentage in the adhesive layer is about 1% or less.

The present disclosure, unlike the conventional art, requires no application of a flux on the bonding pads 31 of the package substrate 30 since the adhesive layer 12 contains a component capable of serving as a flux. Therefore, a flux application process on the bonding pads and a flux washing process can be skip in the present disclosure.

(c) Step of Melting Bumps

Figure 5:
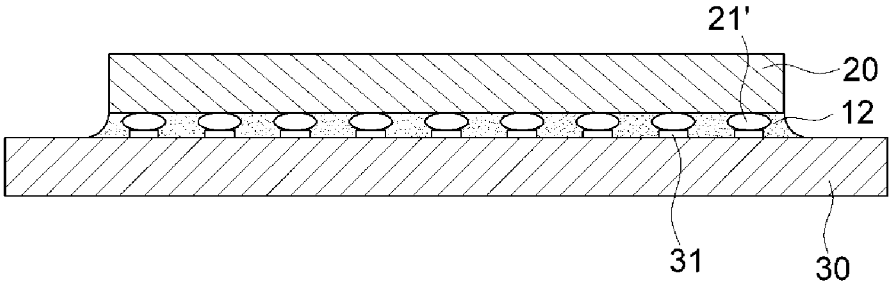

As shown in FIG. 5, the bumps 21 of the semiconductor chip 20 are melted to electrically and mechanically connect the semiconductor chip 20 and the package substrate 30 (hereinafter, "step S300").

In step S300, the bumps are reflowed in an oven at about 150 to 300° C., specifically about 170 to 270° C., wherein the bumps are melted to electrically and mechanically connect the semiconductor chip 20 and the package substrate 30. The adhesive layer 12 disposed between the semiconductor chip 20 and the package substrate 30 is also melted, and thus the void area percentage in the adhesive layer is further reduced to about 0.5% or less. Therefore, the connection reliability of the semiconductor package manufactured according to the present disclosure can be further improved.

(d) Step of Curing Adhesive Layer

Figure 6:
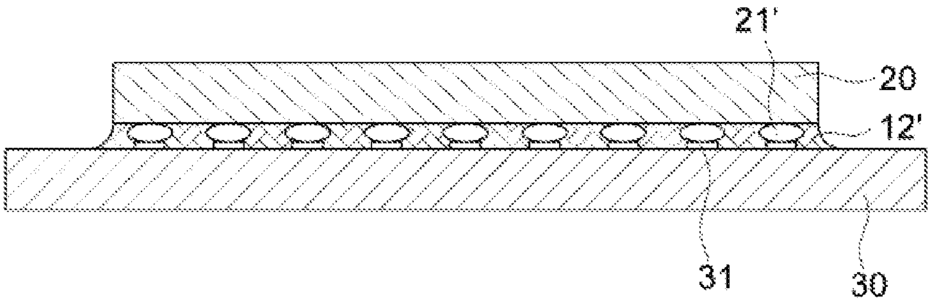

As shown in FIG. 6, the adhesive layer 12 disposed between the semiconductor chip 20 and the package substrate 30, which have been connected in step S300, is cured (hereinafter, "step S400").

Since the adhesive layer 12 of the present disclosure has an onset temperature of about 160 to 220° C., step S400 may be performed at a temperature higher than the above-described onset temperature, for example, about 170 to 250° C.

The curing time of the adhesive layer is adjusted controlled according to the curing temperature and may be, for example, about 0.5 to 3 hours.

Hereinafter, the present disclosure is described in detail through examples, but the following examples are only for illustrating an embodiment of the present invention, and the scope of the present invention is not limited by the following examples.

Examples 1-3 and Comparative Example 1: Manufacturing of Underfill Films

1-1. Preparation of Adhesive Resin Compositions

Adhesive resin compositions of Examples 1 to 3 and Comparative Example 1 were prepared by mixing respective ingredients according to the compositions shown in Table 1 below. The unit of the content of each ingredient shown in Table 1 was wt % and expressed relative to the total weight of the corresponding resin composition.

1-2. Manufacturing of Underfill Films

Each non-conductive adhesive film was manufactured by die-coating of each of the adhesive resin compositions prepared in Example 1-1 on one surface of a PET release film (thickness: 38 μm), followed by drying to form an adhesive layer (thickness: 18 μm).

TABLE 1

| Adhesive resin composition | | Example 1 | Example 2 | Example 3 | Comparative Example 1 |
|---|---|---|---|---|---|
| Two type or more of epoxy resins | YD-128 | 10 | 10 | 10 | 10 |
| | YP-50 | 25 | 25 | 25 | 25 |
| | KDCP-130 | 20 | 20 | 20 | 20 |
| Curing agent | MHHPA | 14.9 | 14.9 | 14.98 | 14.8 |
| N-containing heterocyclic compound | 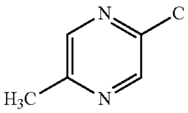 | 0.1 | — | — | -— |
| | 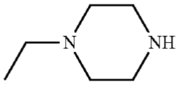 | — | 0.1 | — | — |
| | 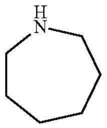 | — | — | 0.02 | — |
| | 2PZ-CZ | — | — | — | 0.2 |
| Nano-silica | 10~100 nm | 30 | 30 | 30 | 30 |

YD-128: KUKDO Chemical co., Ltd.
YP-50: KUKDO Chemical co., Ltd.
KDCP-130: KUKDO Chemical co., Ltd.
2PZ-CZ: 1-cyanoethyl-2-phenylimidazole
* MHHPA: Methylhexahydrophthalic anhydride Test Example 1: Evaluation of Physical Properties The non-conductive adhesive films manufactured in Examples 1 to 3 and Comparative Example 1 were measured for physical properties by the following methods, and the measurement results are shown in Table 2 below.

1) Onset Temperature

The non-conductive adhesive films were measured for the onset temperature by using differential scanning calorimetry (DSC).

2) Melt Viscosity

The non-conductive adhesive films were measured for viscosity by using a rheometer while the temperature was elevated from 50° C. to 300° C. at a rate of 10° C. per minute.

TABLE 2

| | Example 1 | Example 2 | Example 3 | Comparative Example 1 |
|---|---|---|---|---|
| Onset Temperature (° C.) | 171 | 175 | 198 | 140 |
| Melt Viscosity (Pa · s) | 2775 | 980 | 450 | 4537 |

The invention claimed is:

1. An underfill film for a semiconductor package, comprising:

a base; and an adhesive layer disposed on one surface of the base and having a lowest melt viscosity of 3000 Pa·s or less at 160 to 170° C., wherein the adhesive layer is a cured product of an adhesive resin composition comprising: (a) an epoxy resin containing a liquid epoxy resin, a phenoxy resin, and a multifunctional epoxy resin; (b) an acid anhydride curing agent; (c) a nitrogen (N)-containing heterocyclic compound; and (d) a filler, wherein the phenoxy resin is a compound represented by the following Chemical Formula 1:

[Chemical Formula 1]

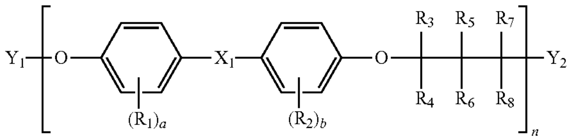

wherein, in Chemical Formula 1, a and b are each an integer of 1 to 4;

a plurality of $R_1$ and a plurality of $R_2$ are the same as or different from each other and are each independently selected from the group consisting of hydrogen, halogen, a $C_1$-$C_{10}$ alkyl group, a $C_3$-$C_{20}$ cycloalkyl group, a $C_5$-$C_{20}$ aryl group and a nitro group;

$R_3$ to $R_8$ are the same as or different from each other and are each independently hydrogen or a hydroxy group, provided that at least one of $R_3$ to $R_8$ is a hydroxy group;

$X_1$ is a single bond or a $C_1$-$C_{10}$ alkylene group;

$Y_1$ and $Y_2$ are the same as or different from each other and are each independently hydrogen, a hydroxy group, or an epoxy group, provided that at least one of $Y_1$ and $Y_2$ is an epoxy group; and n is an integer of 30 to 400, and wherein the N-containing heterocyclic compound is at least one selected from the group consisting of a compound represented by Chemical Formula 2 and a compound represented by Chemical Formula 3:

[Chemical Formula 2]

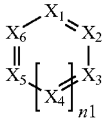

[Chemical Formula 3]

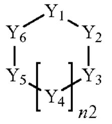

wherein in Chemical Formulas 2 and 3, n1 is 1 or 2;

n2 is an integer of 0 to 2;

$X_1$ to $X_6$ are the same as or different from each other and are each independently N or $C(R_1)$, provided that at least one of $X_1$ to $X_6$ is N;

$Y_1$ to $Y_6$ are the same as or different from each other and are each independently $N(R_2)$ or $C(R_3)(R_4)$, provided that at least one of $Y_1$ to $Y_6$ is $N(R_2)$;

a plurality of $C(R_1)$ are the same as or different from each other, a plurality of $N(R_2)$ are the same as or different from each other, and a plurality of $C(R_3)(R_4)$ are the same as or different from each other; and $R_1$, $R_2$, $R_3$, and $R_4$ are each independently selected from the group consisting of hydrogen, deuterium (D), halogen, a cyano group, a nitro group, a $C_1$-$C_{20}$ alkyl group, a $C_2$-$C_{20}$ alkenyl group, and a $C_2$-$C_{20}$ alkynyl group.

2. The underfill film of claim 1, wherein when the adhesive layer is disposed between a semiconductor chip with bumps and a package substrate with bonding pads, followed by compression under conditions of 200° C., 30-100 N, and 1-3 seconds, a void area percentage of the adhesive layer is 1% or less per $m^2$.

3. The underfill film of claim 2, wherein the thickness of the adhesive layer is in a range of 80 to 120% of an interval between the semiconductor chip and the package substrate.

4. The underfill film of claim 1, wherein an onset temperature on differential scanning calorimetry (DSC) is in the range of 160 to 220° C.

5. The underfill film of claim 1, wherein the adhesive resin composition contains, relative to a total weight thereof, 40 to 80 wt % of the epoxy resin, 5 to 20 wt % of the curing agent, 0.01 to 5 wt % of the N-containing heterocyclic compound, and 10 to 50 wt % of the filler.

6. The underfill film of claim 1, wherein the liquid epoxy resin, the phenoxy resin, and the multifunctional epoxy resin are contained at a weight ratio of 1:1-3:1-3.

7. A method for manufacturing a semiconductor package, the method comprising:

compressing the adhesive layer of the underfill film of claim 1 on bumps of a semiconductor chip with the bumps;

aligning the bumps of the semiconductor chip, on which the adhesive layer has been compressed, with bonding pads of a package substrate, the bonding pads being included in regions corresponding to positions of the bumps;

melting the bumps of the semiconductor chip to connect the semiconductor chip to the package substrate; and curing the adhesive layer disposed between the connected semiconductor chip and package substrate.

8. The method of claim 7, wherein the aligning between the bumps and the bonding pads is performed by compression under conditions of 200° C., 30-100 N, and 1-3 seconds, and a void area percentage in the adhesive layer is 1% or less after the compressing.

9. The method of claim 8, wherein the void area percentage in the adhesive layer is 0.5% or less after the melting of the bumps.

10. The method of claim 7, wherein the curing temperature of the adhesive layer is in a range of 170 to 250° C.

11. The method of claim 7, wherein a thickness of the adhesive layer is in a range of 80 to 120% of the interval between the semiconductor chip and the package substrate.

12. The method of claim 7, wherein the adhesive resin composition contains, relative to a total weight thereof, 40 to 80 wt % of the epoxy resin, 5 to 20 wt % of the curing agent, 0.01 to 5 wt % of the N-containing heterocyclic compound, and 10 to 50 wt % of the filler.

13. The method of claim 7, wherein the liquid epoxy resin, the phenoxy resin, and the multifunctional epoxy resin are contained at a weight ratio of 1:1-3:1-3.

* * * * *